United States Patent
Li

(10) Patent No.: US 10,763,458 B2
(45) Date of Patent: Sep. 1, 2020

(54) MANUFACTURING METHOD OF COLOR FILTER SUBSTRATE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Wenjie Li, Guangdong (CN)

(73) Assignee: SHENZHEN CHINA STAR OPTOELECTRONICS SEMICONDUCTOR DISPLAY TECHNOLOGY CO., LTD, Shenzhen, Guangdong (CN)

( * ) Notice: Subject to any disclaimer, the term of this patent is extended or adjusted under 35 U.S.C. 154(b) by 398 days.

(21) Appl. No.: 15/576,820

(22) PCT Filed: Nov. 8, 2017

(86) PCT No.: PCT/CN2017/109837
§ 371 (c)(1),
(2) Date: Nov. 26, 2017

(87) PCT Pub. No.: WO2019/051968
PCT Pub. Date: Mar. 21, 2019

(65) Prior Publication Data
US 2019/0081282 A1     Mar. 14, 2019

(51) Int. Cl.
| C23C 14/34 | (2006.01) |
| H01L 51/56 | (2006.01) |
| H01L 27/32 | (2006.01) |
| H01L 51/52 | (2006.01) |
| G02B 5/20 | (2006.01) |
| C23C 14/06 | (2006.01) |
| G02B 5/00 | (2006.01) |

(52) U.S. Cl.
CPC .............. *H01L 51/56* (2013.01); *C23C 14/06* (2013.01); *G02B 5/20* (2013.01); *H01L 27/322* (2013.01); *H01L 51/5284* (2013.01); *G02B 5/003* (2013.01); *G02B 5/201* (2013.01)

(58) Field of Classification Search
CPC ..................................................... C23C 14/06
See application file for complete search history.

(56) References Cited

U.S. PATENT DOCUMENTS 10,503,064 B2 * 12/2019 Li ......................... H01L 27/322

* cited by examiner

*Primary Examiner* — Jason Berman
(74) *Attorney, Agent, or Firm* — Soroker Agmon Nordman

(57) ABSTRACT

A manufacturing method of a color filter substrate is provided. The manufacturing method includes steps of providing a substrate comprising a color filter region and a black matrix region; depositing a black matrix layer on a surface of the substrate in the black matrix region; applying an RGB color resist to the color filter region of the substrate; correspondingly forming a plurality of photo spacers on a surface of the black matrix, the photo spacers being made from light-shielding material; forming a protective layer above the substrate. The photo spacers made from light-shielding material is arranged on the surface of the black matrix to prevent the transmission of light rays through the RGB color resist that results in mixture of colors.

18 Claims, 4 Drawing Sheets

MANUFACTURING METHOD OF COLOR FILTER SUBSTRATE

FIELD OF INVENTION

The present disclosure relates to the technical field of display technology, and more particularly to a manufacturing method of a color filter substrate.

BACKGROUND OF INVENTION

Organic light-emitting diodes (OLEDs) have been widely applied due to their advantages such as good self-illumination property, excellent contrast, quick response and flexible display.

There are following several ways for OLEDs to achieve full-color display: a: directly emit light by RGB organic light-emitting materials; b: white organic light-emitting device (WOLED) with a color filter; and c: light-to-color conversion with a blue light-emitting layer and a light-to-color conversion layer.

At present, the design of color filter in OLEDs needs to refer to the design of color filter in liquid crystal displays (LCD). In LCDs, the use of the color filter is necessary for achieving full-color display. A color filter substrate I generally comprises a black matrix (BM) 12, ala RGB color resist 13, a protective layer 14, and a plurality of photo spacers (PS) 15. The specific structure is shown in FIG. 1.

In an existing OLED structure, the photo spacers 15 are located above the protective layer 14. This may increase the distance between the WOLED and the color filter substrate 1, resulting in the mixture of colors. Furthermore, the photo spacers 15 are generally made from organic photoresists, which are pale yellow in color, and have certain light transmittance.

SUMMARY OF INVENTION

The present disclosure provides a manufacturing method of a color filter substrate, by which the thickness of the color filter substrate can be reduced simply by changing the arrangement of the photo spacer, and the mixture of colors, which is caused by the transmission of light rays through the color filter substrate, can be improved so that the display quality of display devices can be improved.

According to one aspect of the present disclosure, the present disclosure provides a manufacturing method of a color filter substrate. The manufacturing method includes steps of:

step S10, providing a substrate comprising a color filter region and a black matrix region;

step S20, depositing a black matrix layer on a surface of the substrate, and patterning the black matrix layer to form a black matrix so as to completely remove portions of the black matrix layer within the color filter region;

step S30, applying an RGB color resist to the color filter region of the substrate;

step S40, correspondingly forming a plurality of photo spacers on a surface of the black matrix, the photo spacers being made from a light-shielding material, the length of the photo spacers being equal to that of a long side of the RGB color resist;

step S50, forming a protective layer above the substrate, the protective layer entirely covering the black matrix, the photo spacers and the RGB color resist, wherein the photo spacers made from the light-shielding material are arranged on the surface of the black matrix to prevent the transmission of light rays through the RGB color resist that results in mixture of colors.

According to a preferred embodiment of the present disclosure, the photo spacers are made from one of organic photoresists, black sealants, opaque metals, metal oxides and nitrides.

According to a preferred embodiment of the present disclosure, the photo spacers are made from organic photoresists and the photo spacers a formed on the surface of the black matrix by nozzle printing or ink jetting.

According to a preferred embodiment of the present disclosure, the photo spacers are formed by applying an organic solution and the photo spacers are formed by curing an organic solution while applying the organic solution on the surface of the black matrix.

According to a preferred embodiment of the present disclosure, the photo spacers are made from opaque metals or metal oxides and the photo spacers are arranged on the surface of the black matrix by one of thermal evaporation, magnetron sputtering, chemical vapor deposition and atomic layer deposition.

According to a preferred embodiment of the present disclosure, the protective layer covering the photo spacers is a thin-film layer of compact oxide, and the oxide is one or both of silicon oxide and aluminum oxide.

According to a preferred embodiment of the present disclosure, the protective layer is formed by magnetron sputtering, chemical vapor deposition or atomic layer deposition.

According to a preferred embodiment of the present disclosure, the substrate is a rigid substrate or flexible substrate.

According to a preferred embodiment of the present disclosure, the step S20 of forming a black matrix comprises:

forming, on the surface of the substrate, the black matrix successively by applying, pre-baking, exposing, developing and baking processes.

According to another aspect of the present disclosure, the present disclosure provides a manufacturing method of a color filter substrate. The manufacturing method includes steps of:

step S10, providing a substrate comprising a color filter region and a black matrix region;

step S20, depositing a black matrix layer on a surface of the substrate, and patterning the black matrix layer to form a black matrix so as to completely remove portions of the black matrix layer within the color filter region;

step S30, applying an RGB color resist to the color filter region of the substrate;

step S40, correspondingly forming a plurality of photo spacers on a surface of the black matrix, the photo spacers being made from a light-shielding material;

step S50, forming a protective layer above the substrate, the protective layer entirely covering, the black matrix, the photo spacers and the RGB color resist, wherein the photo spacers made from the light-shielding material are arranged on the surface of the black matrix to prevent the transmission of light rays through the RUB color resist that results in mixture of colors.

According to a preferred embodiment of present disclosure, the photo spacers are made from one of organic photoresists, black sealants, opaue metals, metal oxides and nitrides.

According to a preferred embodiment of the present disclosure, the photo spacers are made from organic photoresists and the photo spacers are formed on the surface of the black matrix by nozzle printing or ink jetting.

According to a preferred embodiment of the present disclosure, the photo spacers are formed by applying an organic solution and the photo spacers are formed by curing an organic solution while applying the organic solution on the surface of the black matrix.

According to a preferred embodiment of the present disclosure, the photo spacers are made from opaque metals or metal oxides and the photo spacers are arranged on the surface of the black matrix by one of thermal evaporation, magnetron sputtering, chemical vapor deposition and atomic layer deposition.

According to a preferred embodiment of the present disclosure, the protective layer covering the photo spacers is a thin-film layer of compact oxide, and the oxide is one or both of silicon oxide and aluminum oxide.

According to a preferred embodiment of the present disclosure, the protective layer is formed by magnetron sputtering, chemical vapor deposition or atomic layer deposition.

According to a preferred embodiment of present disclosure, the substrate is a rigid substrate or flexible substrate.

According to a preferred embodiment of the present disclosure, the step S20 of forming a black matrix comprises:

forming, on the surface of the substrate, the black matrix successively by applying, pre-baking, exposing, developing and baking processes.

The present disclosure provides a manufacturing method of a color filter substrate. In the present disclosure, by the arrangement of the opaque photo spacer on the black matrix, the thickness of the color filter substrate can be reduced, and the mixture of colors, which is caused by the transmission of light rays through the color filter substrate, can be improved so that the display quality of display devices can be improved.

DESCRIPTION OF DRAWINGS

The technical solution, as well as beneficial advantages, of the present disclosure will be apparent from the following detailed description of the specific embodiments of the present disclosure, with reference to the accompanying drawings.

DETAILED DESCRIPTION OF THE PREFERRED EMBODIMENTS

Figure 1:
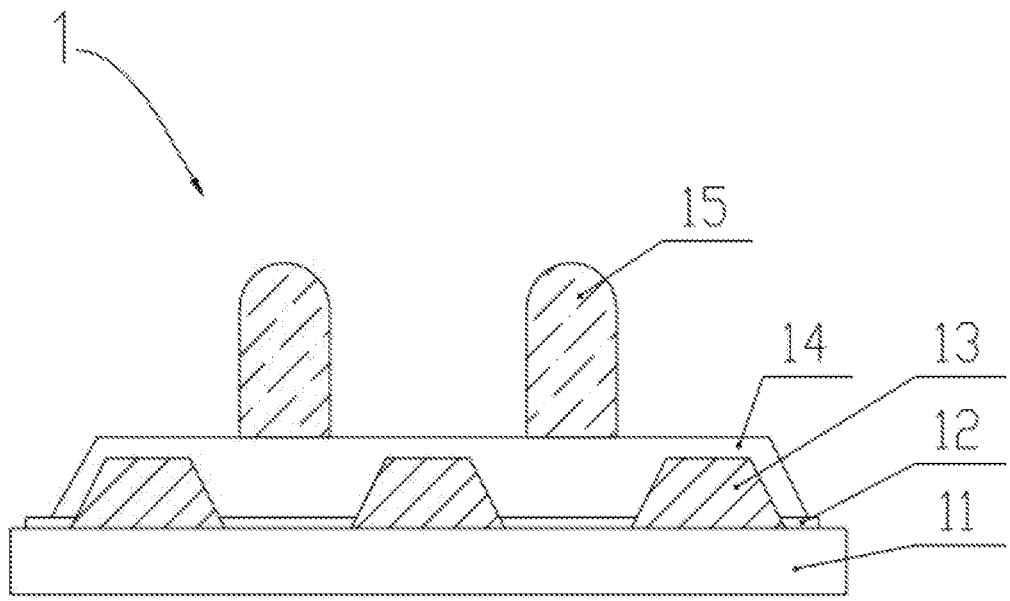
FIG. 1 is a structural view of a color filter substrate according to the prior art.

Following description of each embodiment is referring to the accompanying drawings so as to illustrate practicable specific embodiments in accordance with the present disclosure. The directional terms described in the present disclosure, such as upper, lower, front, rear, left, right, inner, outer, side and etc., are only directions referring to the accompanying drawings, so that the used directional terms are used to describe and understand the present disclosure, but the present disclosure is not limited therein. In the drawings, similar structural units are designated by the same reference numerals.

The present disclosure will be further described below with reference to the accompanying drawings by embodiments.

Figure 2:
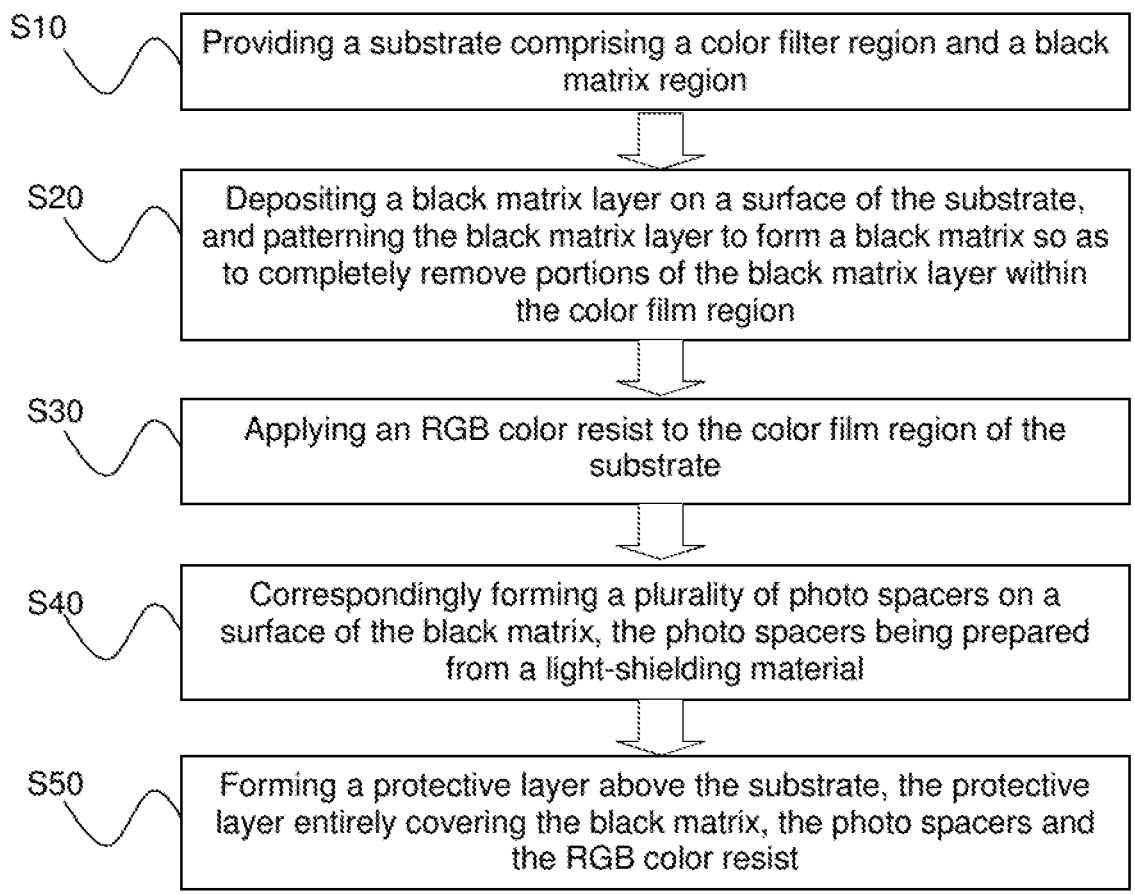
FIG. 2 is a flowchart of a process of manufacturing a color filter substrate according to an embodiment of the present disclosure.
Figure 3:
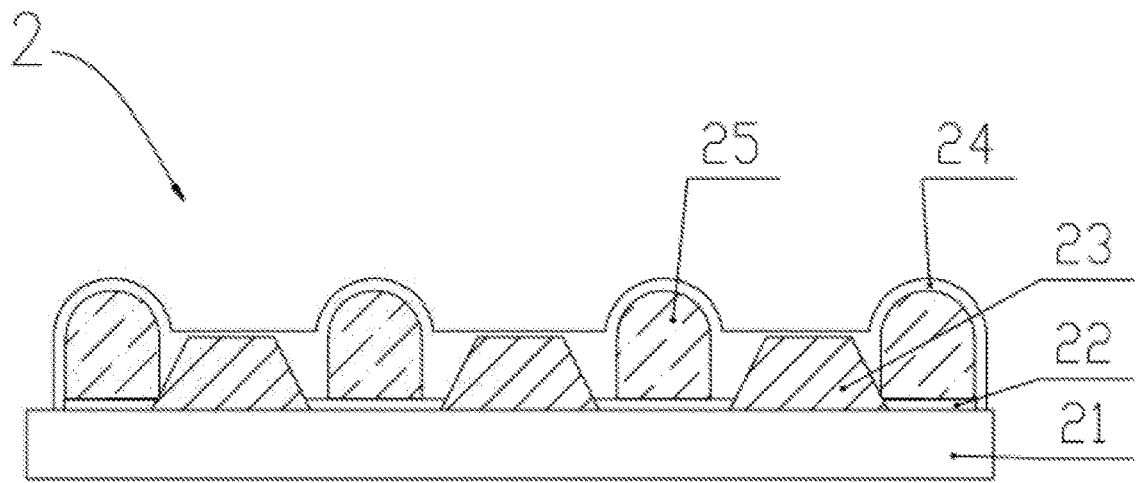
FIG. 3 is a structural view of a color filter substrate according to an embodiment of the present disclosure.

FIG. 2 is a flowchart of a process of manufacturing a color filter substrate according to an embodiment of the present disclosure. FIG. 3 is a structural view of a color filter substrate according to an embodiment of the present disclosure.

As shown in FIG. 2, the present disclosure provides a manufacturing method of a color filter substrate 2. The manufacturing method of the color filter substrate 2 comprises following steps.

Figure 4A:
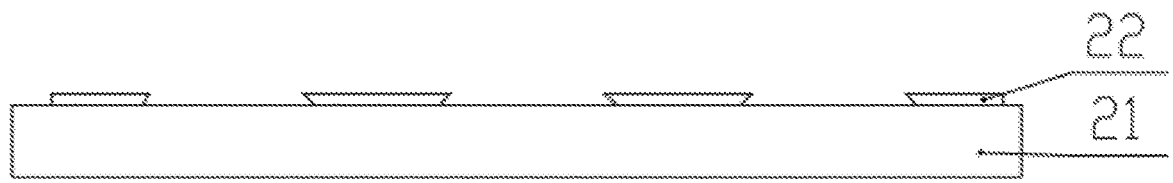
FIGS. 4a-4d are schematic views illustrating processes of manufacturing a color filter substrate according to an embodiment of the present disclosure.

Step S10: as shown in FIG. 4a, a substrate 21 is provided, the substrate 21 comprising a color filter region and a black matrix region.

The substrate 21 provided in the step S10 may be a rigid substrate, for example, a glass substrate; or may be a flexible substrate, for example, a polyimide film.

The color filter region and the black matrix region are alternately distributed.

Step S20: a black matrix layer is deposited on a surface of the substrate 21, and the black matrix layer is patterned to form a black matrix 22 so as to completely remove portions of the black matrix layer within the color filter region.

The step S20 is as follows: forming, on the surface of the substrate 21, the black matrix 22 successively by applying, pre-baking, exposing, developing and baking processes.

The black matrix layer may be formed by slit coating or spin coating.

Figure 4B:
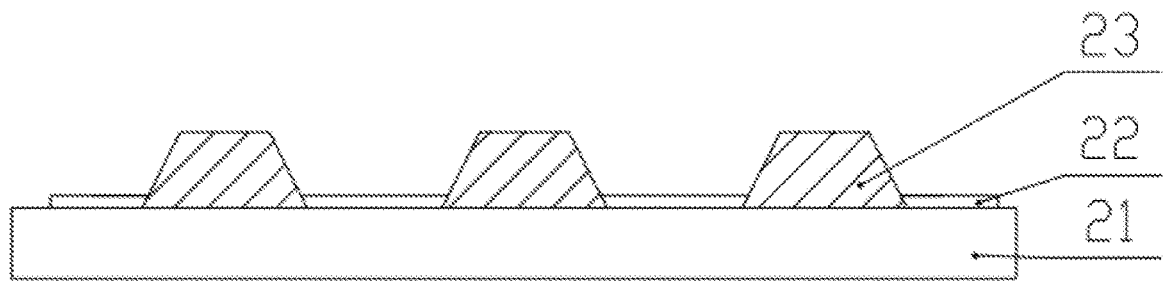

Step S30: as shown in FIG. 4b, an RGB color resist 23 is applied to the color filter region of the substrate 21.

The RGB color resist 23 may be formed by dispersing RGB pigments in an organic solvent, or may be RGB quantum dot material.

Generally, the RGB color resist 23 comprises a plurality of color resist regions each comprising one red color resist, one green color resist and one blue color resist.

The RGB color resist 23 may be formed by slit coating or spin coating.

Step S30 may be as follows: applying a red photoresist entirely on the black matrix 22, forming a red color resist in a clear area of the black matrix after being exposed and developed, and then forming a green color resist and a blue color resist on the surface of the black matrix 22 in a same way to further form the RGB color resist 23.

The shape of the RGB color resist 23 is the same as that of pixels in an OLED matched thereto.

Figure 4C:
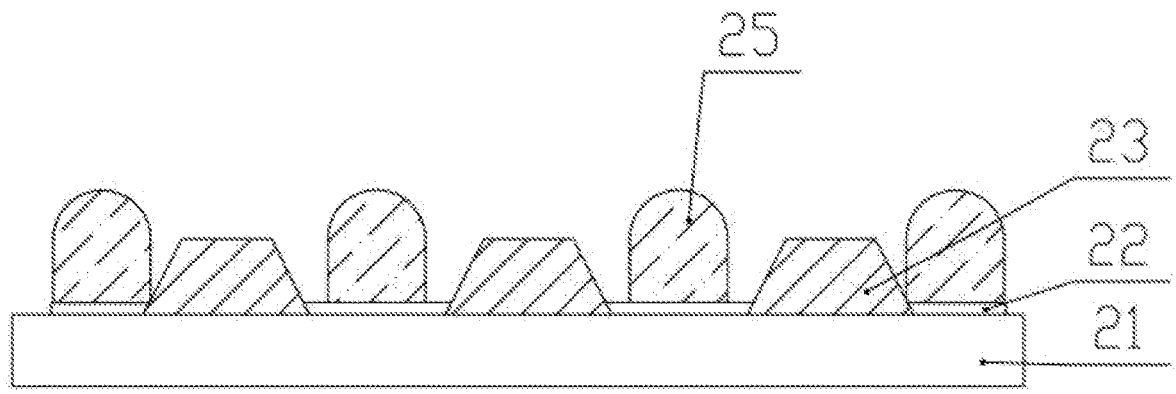

Step S40: as shown in FIG. 4c, a plurality of photo spacers 25 are correspondingly formed on the surface of the black matrix 22, the photo spacers 25 being made from a light-shielding material.

The photo spacers 25 are made from one of black photoresists, black sealants, glass cements, opaque metals, metal oxides, nitrides, and transparent OLED packing sealants.

When the photo spacers 25 are made from organic photoresists, the photo spacers 25 are formed by an adhesive dispenser, silk screen printing, nozzle printing, ink jetting or the like. The photo spacers 25 are formed by applying an organic solution and the organic solution is cured while applying.

The step S40 may be as follows: applying a black sealant on the surface of the black matrix 22. The black sealant contains resin as its main component. While applying the black sealant, the black sealant is also being cured at the same time. The height of the sealant is controlled by adjusting parameters such as the applying pressure and the aperture of the nozzle, in order to form a plurality of photo spacers 25 with a proper height.

When the photo spacers 25 are made from metals or metal oxides, the photo spacers 25 are formed by thermal evaporation, magnetron sputtering or chemical vapor deposition.

Figure 5:
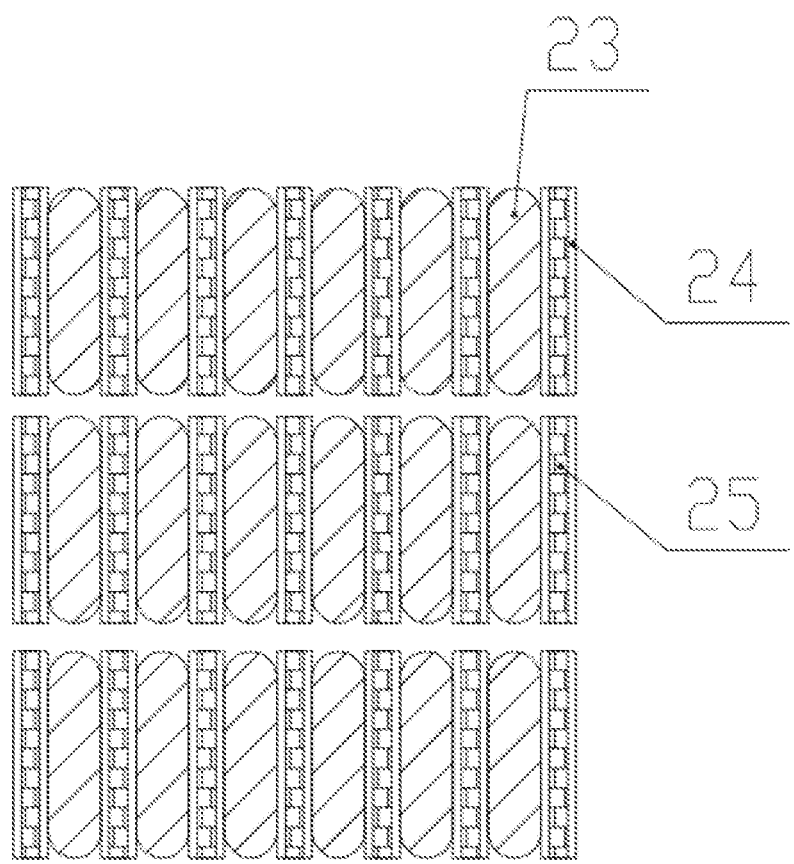
FIG. 5 is a top structural view of the color filter substrate according to an embodiment of the present disclosure.

As shown in FIG. 5, the length of the photo spacers 25 is equal to that of the longest side of the RGB color resist 23. Such an arrangement is made because the mixture of colors, which is caused by the transmission of light rays through the RGB color resist 23, often occurs in the region of the long side of the RGB color resist. The arrangement of the opaque photo spacer 25 can completely isolate different light rays from each other, avoiding the mutual influence between light rays in different colors.

Figure 4D:
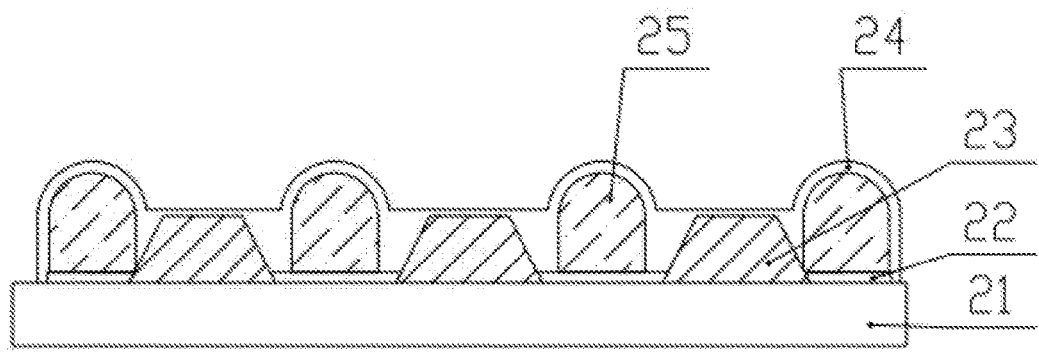

Step 50: as shown in FIG. 4d, a protective layer 24 is formed above the substrate 21. The protective layer 24 entirely covers the black matrix 22, the photo spacers 25 and the RGB color resist 23.

The protective layer 25 functions as a buffer layer, so it may also be called a buffer layer. The protective layer 25 is a thin-film layer of compact oxide. The oxide is preferably one or at least two of silicon oxide, silicon nitride and aluminium oxide.

The protective layer 25 may be formed by magnetron sputtering, chemical vapor deposition or atomic layer deposition.

The protective layer 25 plays a role of isolating high-transmittance organic fillers from the RGB color resist 23, and also a role of isolating organic photoresist gases.

The photo spacers made from the light-shielding material are arranged on the surface of the black matrix to prevent the transmission of light rays through the RGB color resist that results in mixture of colors.

In the present disclosure, by the arrangement of the opaque photo spacer on the black matrix, the thickness of the color filter substrate can be reduced, and the mixture of colors, which is caused by the transmission of light rays through the color filter substrate, can be improved so that the display quality of display devices can be improved.

Although the present disclosure has been described with reference to the preferred embodiment thereof, it is apparent to those skilled in the art that a variety of modifications and changes may be made without departing from the scope of the present disclosure which is intended to be defined by the appended claims.

What is claimed is:

1. A manufacturing method of a color filter substrate, comprising steps of:
    step S10, providing a substrate comprising a color filter region and a black matrix region;
    step S20, depositing a black matrix layer on a surface of the substrate, and patterning the black matrix layer to form a black matrix so as to completely remove portions of the black matrix layer within the color filter region;
    step S30, applying an RGB color resist to the color filter region of the substrate;
    step S40, correspondingly forming a plurality of photo spacers on a surface of the black matrix, the photo spacers being made from a light-shielding material, the length of the photo spacers being equal to that of a long side of the RGB color resist; and
    step S50, forming a protective layer above the substrate, the protective layer entirely covering the black matrix, the photo spacers and the RGB color resist,
    wherein the photo spacers made from the light-shielding material are arranged on the surface of the black matrix to prevent the transmission of light rays through the RGB color resist that results in mixture of colors.

2. The manufacturing method of a color filter substrate as claimed in claim 1, wherein the photo spacers are made from one of organic photoresists, black sealants, opaque metals, metal oxides and nitrides.

3. The manufacturing method of a color filter substrate as claimed in claim 2, wherein the photo spacers are made from organic photoresists and the photo spacers are formed on the surface of the black matrix by nozzle printing or ink jetting.

4. The manufacturing method of a color filter substrate as claimed in claim 2, wherein the photo spacers are formed by applying an organic solution and the photo spacers are formed by curing an organic solution while applying the organic solution on the surface of the black matrix.

5. The manufacturing method of a color filter substrate as claimed in claim 2, wherein the photo spacers are made from opaque metals or metal oxides and the photo spacers are arranged on the surface of the black matrix by one of thermal evaporation, magnetron sputtering, chemical vapor deposition and atomic layer deposition.

6. The manufacturing method of a color filter substrate as claimed in claim 1, wherein the protective layer covering the photo spacers is a thin-film layer of compact oxide, and the oxide is one or both of silicon oxide and aluminum oxide.

7. The manufacturing method of a color filter substrate as claimed in claim 1, wherein the protective layer is formed by magnetron sputtering, chemical vapor deposition or atomic layer deposition.

8. The manufacturing method of a color filter substrate as claimed in claim 1, wherein the substrate is a rigid substrate or a flexible substrate.

9. The manufacturing method of a color filter substrate as claimed in claim 1, wherein the step S20 of forming a black matrix comprises:
    forming, on the surface of the substrate, the black matrix successively by applying, pre-baking, exposing, developing and baking processes.

10. A manufacturing method of a color filter substrate, comprising steps of:
    step S10, providing a substrate comprising a color filter region and a black matrix region;
    step S20, depositing a black matrix layer on a surface of the substrate, and patterning the black matrix layer to form a black matrix so as to completely remove portions of the black matrix layer within the color filter region;
    step S30, applying an RGB color resist to the color filter region of the substrate;
    step S40 correspondingly forming a plurality of photo spacers on a surface of the black matrix, the photo spacers being made from a light-shielding material; and
    step S50, forming a protective layer above the substrate, the protective layer entirely covering the black matrix, the photo spacers and the RGB color resist,
    wherein the photo spacers made from the light-shielding material are arranged on the surface of the black matrix to prevent the transmission of light rays through the RGB color resist that results in mixture of colors.

11. The manufacturing method of a color filter substrate as claimed in claim 10, wherein the photo spacers are made from one of organic photoresists, black sealants, opaque metals, metal oxides and nitrides.

12. The manufacturing method of a color filter substrate as claimed in claim 11, wherein the photo spacers are made from organic photoresists and the photo spacers are formed on the surface of the black matrix by nozzle printing or ink jetting.

13. The manufacturing method of a color filter substrate as claimed in claim 12, wherein the photo spacers are formed by applying an organic solution and the photo spacers are formed by curing an organic solution while applying the organic solution on the surface of the black matrix.

14. The manufacturing method of a color filter substrate as claimed in claim 11, wherein the photo spacers are made from opaque metals or metal oxides and the photo spacers are arranged on the surface of the black matrix by one of thermal evaporation, magnetron sputtering, chemical vapor deposition and atomic layer deposition.

15. The manufacturing method of a color filter substrate as claimed in claim 10, wherein the protective layer covering the photo spacers is a thin-film layer of compact oxide, and the oxide is one or both of silicon oxide and aluminum oxide.

16. The manufacturing method of a color filter substrate as claimed in claim 15, wherein the protective layer is formed by magnetron sputtering, chemical vapor deposition or atomic layer deposition.

17. The manufacturing method of a color filter substrate as claimed in claim 10, wherein the substrate is a rigid substrate or flexible substrate.

18. The manufacturing method of a color filter substrate as claimed in claim 10, wherein the step S20 of forming a black matrix comprises:

forming, on the surface of the substrate, the black matrix successively by applying, pre-baking, exposing, developing and baking processes.

* * * * *

UNITED STATES PATENT AND TRADEMARK OFFICE
CERTIFICATE OF CORRECTION

| | |
|---|---|
| PATENT NO. | : 10,763,458 B2 |
| APPLICATION NO. | : 15/576820 |
| DATED | : September 1, 2020 |
| INVENTOR(S) | : Li |

It is certified that error appears in the above-identified patent and that said Letters Patent is hereby corrected as shown below:

On the Title Page

Item (30), Foreign Application Priority Data:
Insert -- Sep. 14, 2017 (CN) ............ 201710828379.9 --.

Signed and Sealed this
Twenty-second Day of December, 2020

Andrei Iancu
*Director of the United States Patent and Trademark Office*